United States Patent

Jones et al.

Patent Number: 6,126,741
Date of Patent: Oct. 3, 2000

[54] POLYCRYSTALLINE CARBON CONVERSION

[75] Inventors: Marshall Gordon Jones, Scotia; Hsin-Pang Wang, Rexford, both of N.Y.

[73] Assignee: General Electric Company, Schenectady, N.Y.

[21] Appl. No.: 09/206,721

[22] Filed: Dec. 7, 1998

[51] Int. Cl.[7] .................................................. C30B 29/04
[52] U.S. Cl. .................. 117/7; 117/9; 117/10; 117/929; 423/446
[58] Field of Search ................. 117/929, 9, 10, 117/7; 423/446

[56] References Cited

U.S. PATENT DOCUMENTS

| | | | |
|---|---|---|---|
| 5,427,051 | 6/1995 | Maxwell et al. | 117/4 |
| 5,514,880 | 5/1996 | Nishmira et al. | 117/8 |
| 5,683,935 | 11/1997 | Miyamato et al. | 438/173 |
| 5,891,241 | 4/1999 | Yoshida | 117/8 |

FOREIGN PATENT DOCUMENTS

| | | |
|---|---|---|
| 19624694 | 1/1998 | Germany . |
| 03265598 | 11/1991 | Japan . |
| 06040712 | 2/1994 | Japan . |

OTHER PUBLICATIONS

Touloukian et al, "Thermal Radiative Properties, Nonmetallic Solids," Thermal Properties of Matter, vol. 8, 1972, pp: cover, 27, 28, and 1757.

*Primary Examiner*—Robert Kunemund
*Attorney, Agent, or Firm*—Marvin Snyder; Douglas E. Stoner

[57] ABSTRACT

A polycrystalline carbon body is converted to a different crystallography by directing an infrared laser beam at a crystal boundary interface. By using a beam having a 5.3 micron wavelength so as to fall within a 5–9 micron range of normal spectral transmittance of the carbon, the interface is heated for solid state conversion by passing the beam through a forward portion of the body without appreciably heating the forward portion. During heating, the interface propagates through the body, thus converting an ever-decreasing aft portion of the body to the different crystallography.

16 Claims, 2 Drawing Sheets

POLYCRYSTALLINE CARBON CONVERSION

BACKGROUND OF THE INVENTION

This invention relates generally to polycrystalline carbon, and, more specifically, to the conversion of polycrystalline diamonds to single crystal diamonds.

Natural diamonds were formed over eons under great pressure and temperature and have unique material properties including hardness and strength. In view of the limited supply of natural diamonds and their associated high cost, synthetic diamonds were developed for use in industrial applications wherein their strength, hardness, and thermal conductivity properties may be used to advantage without the associated high cost of natural diamonds.

Diamond is a unique form of carbon although there are other forms of carbon having similar properties and referred to as diamond-like-carbon (DLC). The single crystal forms of diamond and DLC have optimum material properties due to a lack of grain structure and grain boundaries. Diamond may be found in its polycrystalline form which includes individual small crystals joined together at grain or crystal boundaries. The crystal boundaries reduce the material properties of the diamond in a manner similar to the grain boundaries found in typical metals.

Various superalloys, including nickel based and cobalt based, are specially processed in their liquid or molten state to form single crystal metal bodies upon solidification. However, these processes may not be used for diamond production in view of the extremely high temperature and pressure requirements for diamond production.

In an unrelated development, single crystal sapphire has been obtained in a solid state transformation from polycrystalline alumina. This unique process is disclosed in U.S. Pat. No. 5,427,051, assigned to the present assignee, and uses a localized energy source to heat a portion of a polycrystalline alumina body to a temperature approaching its melting temperature for obtaining solid state conversion to sapphire. However, diamond and sapphire are different materials having different properties.

Accordingly, it is desired to transform polycrystalline diamond into single crystal diamond in a solid state process which is an improvement over the polycrystalline alumina-to-sapphire transformation process of the above patent.

BRIEF SUMMARY OF THE INVENTION

A polycrystalline carbon body is converted to a different crystallography by directing an infrared laser beam at a crystal boundary interface, with the beam having a wavelength within a range of normal spectral transmittance of the carbon to heat the interface for solid state conversion at the interface.

DETAILED DESCRIPTION OF THE INVENTION

As indicated above, U.S. Pat. No. 5,427,051 discloses a solid state process for converting polycrystalline alumina to sapphire by using a localized heating source such as a carbon dioxide ($CO_2$) laser. The laser beam is directed perpendicular to the longitudinal axis of an alumina body at an end thereof for raising its temperature close to the melting point to facilitate propagating solid state conversion along the longitudinal axis. The body may be rotated for ensuring uniform local heating thereof to promote the solid state conversion without undesirable thermal shock to the body.

Polycrystalline alumina and polycrystalline carbon have different material properties, and the solid state conversion of carbon requires an improvement over the solid state alumina conversion process utilized heretofore.

Diamond has a normal spectral transmittance material property, expressed in percent or fraction of unity, indicating its ability to transmit electromagnetic radiation as a function of the wavelength thereof. A single crystal diamond in fiber form, for example, will form an optical waveguide, or fiber optic having the capability to transmit light with total internal reflection and without loss or heating thereby. A polycrystalline carbon or diamond body has crystal or grain boundaries which interrupt energy transmission.

In accordance with a preferred embodiment of the invention, it has been discovered that these properties of diamond or diamond-like carbon (DLC) may be advantageously exploited with the unique properties of a carbon monoxide (CO) laser for effecting the solid state conversion of polycrystalline carbon to a different crystallography, such as single crystal carbon or diamond.

Published data for the normal spectral transmittance of carbon show transmittance values of about 0.6 to about 1.0 over an infrared wavelength range of about 5 to 9 microns. A maximum transmittance approaching unity occurs in the narrow infrared wavelengths between 5.0 and 5.5 microns. Correspondingly, it has been discovered that a carbon monoxide laser emits a laser beam at a wavelength of about 5.3 microns which is uniquely capable of being optimally transmitted through carbon, with the carbon body providing an inherent light pipe or waveguide therefor.

These discoveries may be used to advantage in affecting the solid state conversion process for polycrystalline carbon or diamond to a single crystal. More specifically, FIG. 1 schematically illustrates a polycrystalline carbon body 10, such as diamond, in an exemplary thin rod form for being converted to a single crystal, and FIG. 2 shows an enlarged end portion of the body 10 illustrated in FIG. 1.

Figure 1:
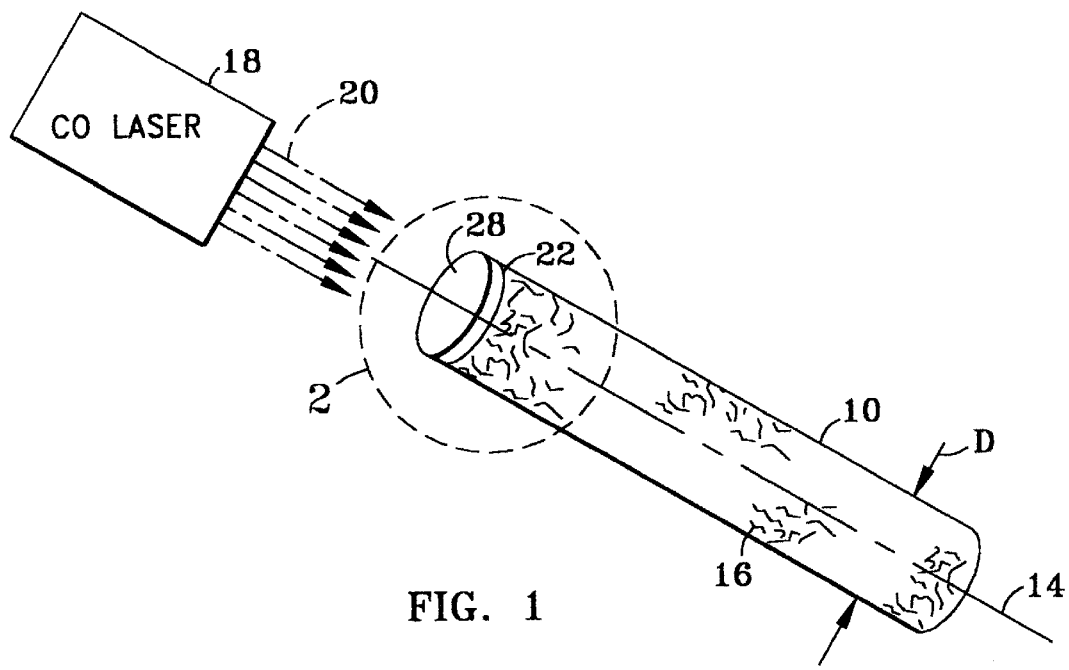
FIG. 1 is schematic representation of a carbon monoxide laser used for converting a cylindrical polycrystalline carbon body to a different crystallography in accordance with one embodiment of the present invention.
Figure 2:
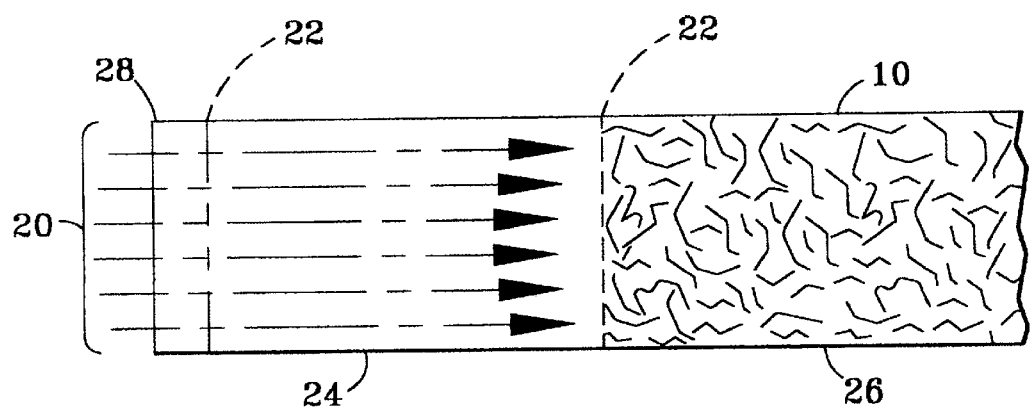
FIG. 2 is an enlarged side view of an end portion of the carbon body illustrated in FIG. 1 within the dashed circle, showing the laser beam passing through the body to heat an interface therein for effecting solid state conversion at the interface.

As initially shown in FIG. 1, body 10 is preferably a thin cylindrical rod or fiber having an outer diameter D which is preferably no larger than about 1 mm. Body 10 is elongate along a longitudinal centerline axis 14 and may have any suitable length ranging from millimeters to meters as desired. The body is initially polycrystalline and therefore has numerous intersecting crystal or grain boundaries 16, shown schematically. Since grain boundaries are microscopic features, they are exaggerated in the figures for clarity of presentation.

A continuous wave, carbon monoxide (CO) laser 18 is optically aligned with one end of body 10, generally coincident therewith along centerline axis 14 in the preferred embodiment. Laser 18 may be of suitable conventional form, including directing mirrors and focusing lenses, for producing an infrared laser beam 20 having a wavelength of about 5.3 microns.

As shown in FIG. 1, laser beam 20 is preferably directed at an interface 22 of grain boundaries 16 which is initially exposed at a distal end of body 10. The 5.3 micron wavelength of CO laser beam 20 is within the 5–9 micron range of normal spectral transmittance of carbon body 10 and locally heats interface 22 to a temperature, approaching the melting temperature of the body, sufficient to produce solid state conversion at interface 22 to a different crystallography, such as the preferred single crystal form of the carbon or diamond.

As indicated above, the normal spectral transmittance of carbon has a maximum value approaching unity at a corresponding wavelength between about 5.0 and 5.5 microns. The 5.3 micron wavelength of CO laser beam 20 is unique in known laser beams as being substantially equal to the wavelength corresponding with the maximum normal spectral transmittance for carbon. This is significant for the ability to propagate grain boundary interface 22 through body 10 in the solid state conversion process and allowing laser beam 20 to continue to reach propagating interface 22 without substantial degradation in energy.

As shown in more detail in FIG. 2, the application of laser beam 20 at interface 22, shown also in phantom initially at the distal end of body 10, heats the interface to near the melting temperature of the carbon to effect the solid state conversion of the carbon to a single crystal form. As this occurs, the laser beam converts body 10 in part at interface 22 into a forward portion 24 having the converted different crystallography, such as single crystal, and an aft portion 26 which remains polycrystalline until converted.

As forward portion 24 of the carbon is created in the solid state conversion to single crystal, laser beam 20 is transmitted therethrough to continue reaching propagating interface 22 for continued heating thereof and propagating the interface through aft portion 26, decreasing its size while simultaneously increasing the size of forward portion 24.

The converted forward portion 24 of the carbon acts as a light pipe or waveguide for transmitting the laser beam through the forming single crystal without substantial loss in beam energy and without attendant heating of forward portion 24. In view of the correspondence between the wavelength of CO laser beam 20 and the normal spectral transmittance at the same wavelength in carbon body 10, maximum transmittance of the laser beam is effected through converted forward portion 24 of the carbon to reach the traveling interface 22 and maintain the heating effect locally at the interface to continue the solid state conversion process. In this way, laser beam 20 is transmitted through forward portion 24 to interface 22 without appreciable, if any, heating of forward portion 24. The heating effected by laser beam 20 is instead concentrated at the traveling interface 22.

In the preferred embodiment, illustrated in FIGS. 1 and 2, carbon body 10 is polycrystalline diamond and the different crystallography effected in the solid state conversion process is single crystal diamond. Polycrystalline diamond aft portion 26 is reduced in length simultaneously with conversion therefrom to the single crystal forward portion 24 at the propagating interface 22.

Figure 4:
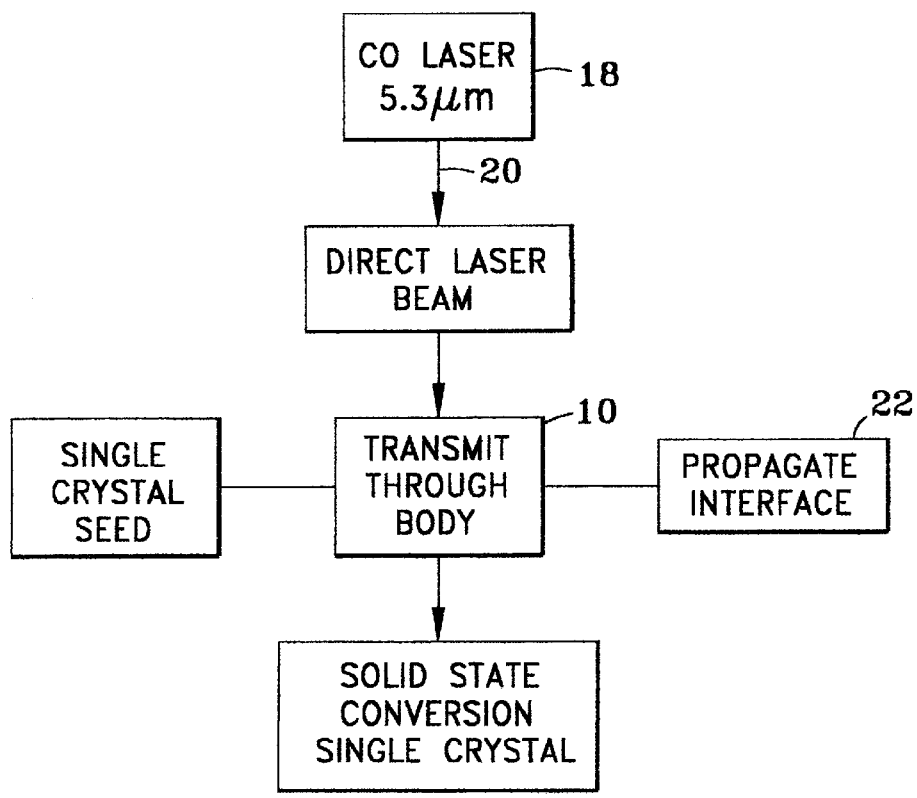
FIG. 4 is a flowchart representation of a method for converting the polycrystalline carbon body to a single crystal in a solid state process in accordance with an exemplary embodiment of the present invention.

FIG. 4 is a flowchart representation of the basic solid state conversion process shown in FIG. 1. The CO laser beam 20 is initially directed at the distal end of polycrystalline body 10 to heat the grain boundary interface and begin the solid state conversion to single crystal. The interface propagates through the polycrystalline body, with the laser beam continuing to reach the traveling interface 22 by transmittance through the converted single crystal forward portion 24 of the body. Interface 22 is propagated in this manner until it has propagated completely across the body to convert the entire body to a single crystal.

As indicated in FIGS. 1 and 2, the solid state conversion process of polycrystalline body 10 is preferably initiated at one end or edge thereof. In the embodiment illustrated, the conversion may be initiated at interface 22 disposed between distal end of body 10 and an adjoining single crystal seed 28. The seed may be formed in any conventional manner to provide a single crystal diamond suitably positioned at the distal end of body 10.

Laser beam 20 may be directed initially through seed 28 with substantially complete transmittance therethrough to heat interface 22 between seed 28 and polycrystalline body 10. The intimate contact between seed 28 and body 10 under the local heating of the applied laser beam permits the solid state conversion of the body and integral attachment to seed 28 to occur, with interface 22 then propagating through remaining aft portion 26 of the body in the solid state conversion process.

In the embodiment illustrated in FIGS. 1 and 2, body 10 is in the form of a thin solid rod, such as a long fiber. By converting the polycrystalline diamond fiber to a single crystal structure, substantial improvements in the material properties of the fiber may be effected. A single crystal diamond fiber has substantial strength and high thermal conductivity properties, for example. Such single crystal fibers may be used in various applications for strength or as optical waveguides, for example.

Figure 3:
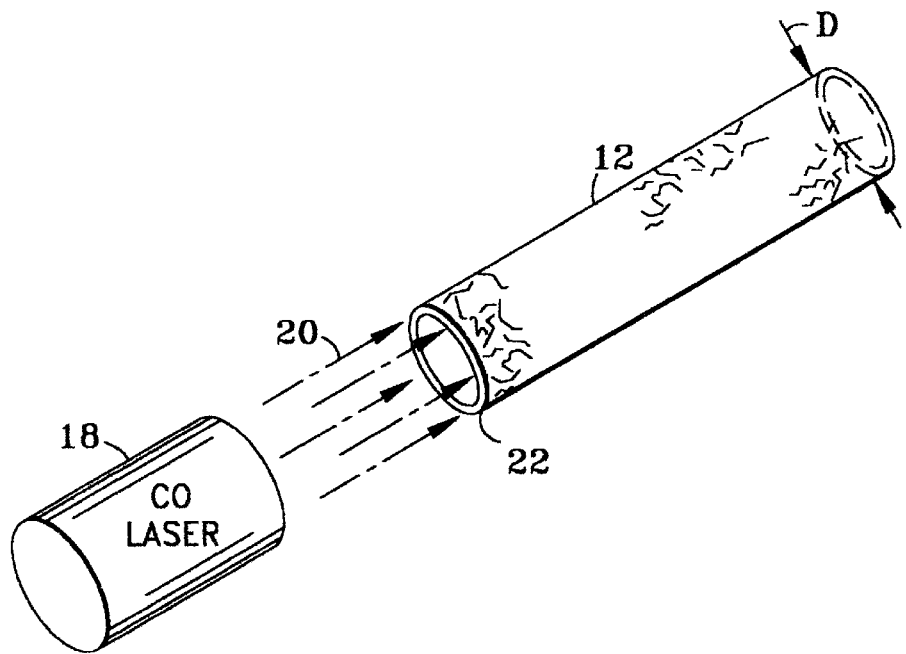
FIG. 3 is a schematic view of the laser illustrated in FIG. 1, directed at a tubular polycrystalline carbon body in accordance with another embodiment of the present invention.

In FIG. 3, the polycrystalline body is in the form of a hollow tube having an outer diameter D up to about 1 mm, for example. The size or diameter of body 12 (and body 10 of FIG. 1) is preferably selected to match the available distribution of laser beam 20 for substantially uniformly heating the body across entire interfaces 22 thereof. One or more of lasers 18 may be used to produce corresponding beams to completely cover entire interface 22 and effect uniform local heating thereof to prevent thermal shock during the conversion process.

In an alternative embodiment, a larger polycrystalline body may be converted using a locally directed laser beam and additionally rotating the body at a sufficient speed for effecting uniform heating at the corresponding interface.

In the two embodiments illustrated in FIGS. 1 and 3, laser beam 20 is initially directed at corresponding interfaces 22 disposed at the distal ends or edges of the bodies. In the FIG. 1 embodiment, adjoining single crystal seed 28 is used, whereas in the FIG. 3 embodiment no single crystal seed is used, but the single crystal conversion occurs spontaneously at interface 22 under the local heating of laser beam 20.

In the various embodiments disclosed above, the CO laser, having unique ability to emit infrared energy at a wavelength corresponding with the maximum or unity normal spectral transmittance of carbon bodies, achieves localized heating of the polycrystalline interface for effecting the solid state conversion to single crystal diamond thereat. The subsequent transmittance of the laser beam through the so-converted single crystal forward portion occurs without significant heating of the forward portion, the heating energy of the laser beam instead being concentrated at the traveling interface, which propagates itself within the body without the need for correspondingly moving either the laser or the body.

While only certain preferred features of the invention have been illustrated and described, many modifications and changes will occur to those skilled in the art. It is, therefore, to be understood that the appended claims are intended to cover all such modifications and changes as fall within the true spirit of the invention.

Accordingly, what is desired to be secured by Letters Patent of the United States is the invention as defined and differentiated in the following claims.

We claim:

1. A method of converting a polycrystalline carbon body comprising directing at a crystal boundary interface of said carbon body an infrared laser beam having a wavelength within a range of normal spectral transmittance of said carbon to heat said interface for solid state conversion thereat to a different crystallography.

2. A method according to claim 1 wherein said carbon transmittance has a maximum value at a corresponding wavelength, and said beam wavelength is about equal thereto.

3. A method according to claim 2 wherein:

said body is elongate;

said beam converting said body in part at said interface into a forward portion having said different crystallography, and an aft portion remaining polycrystalline.

4. A method according to claim 3 further comprising transmitting said beam through said forward portion to reach said interface for continued heating thereof and for propagating said interface through said aft portion so as to decrease the aft portion size while increasing the forward portion size.

5. A method according to claim 4 wherein:

said carbon comprises polycrystalline diamond; and said different crystallography comprises single crystal diamond.

6. A method according to claim 5 wherein said laser beam has a wavelength of about 5.3 microns.

7. A method according to claim 4 further comprising propagating said interface completely through said body to convert said entire body.

8. A method according to claim 4 wherein said beam is transmitted through said forward portion to said interface without appreciable heating of said forward portion.

9. A method according to claim 4 wherein said different crystallography comprises a single crystal.

10. A method according to claim 4 wherein said body comprises a solid rod.

11. A method according to claim 4 wherein said body comprises a hollow tube.

12. A method according to claim 4 further comprising initiating said conversion when said interface is disposed at an edge of said body.

13. A method according to claim 4 further comprising initiating said conversion when said interface is disposed between said body and an adjoining single crystal seed.

14. A method according to claim 13 wherein said body comprises polycrystalline diamond, said seed comprises single crystal diamond, and said different crystallography comprises single crystal diamond.

15. A method according to claim 14 wherein said laser beam has a wavelength of about 5.3 microns.

16. A method according to claim 14 wherein said laser beam is directed coincident with a longitudinal axis of said body.

* * * * *